United States Patent
Dean et al.

(10) Patent No.: US 6,872,468 B1
(45) Date of Patent: Mar. 29, 2005

(54) PEELABLE CIRCUIT BOARD FOIL

(75) Inventors: Timothy B. Dean, Elk Grove Village, IL (US); Gregory J. Dunn, Arlington Heights, IL (US); Remy J. Chelini, Crystal Lake, IL (US); Claudia V. Gamboa, Chicago, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/682,557

(22) Filed: Oct. 9, 2003

(51) Int. Cl.$^7$ ................................................. B21C 37/02
(52) U.S. Cl. ........................ 428/615; 428/629; 428/632; 428/640; 428/670; 428/671; 428/697; 428/702
(58) Field of Search .................................. 428/607, 615, 428/629, 632, 640, 670–671, 697, 702, 210, 701

(56) References Cited

U.S. PATENT DOCUMENTS

| | | | |
|---|---|---|---|
| 5,745,333 | A | 4/1998 | Frankeny et al. |
| 6,183,880 | B1 * | 2/2001 | Yoshioka et al. ............ 428/607 |
| 6,207,522 | B1 | 3/2001 | Hunt et al. |
| 6,346,335 | B1 * | 2/2002 | Chen et al. ................. 428/629 |
| 6,346,355 | B2 | 2/2002 | Sugai et al. |
| 6,524,352 | B2 | 2/2003 | Adae-Amoakoh et al. |
| 6,541,137 | B1 | 4/2003 | Kingon et al. |
| 6,660,406 | B2 * | 12/2003 | Yamamoto et al. ......... 428/615 |
| 2002/0195612 | A1 | 12/2002 | Farrell |
| 2003/0068517 | A1 | 4/2003 | Andresakis et al. |

FOREIGN PATENT DOCUMENTS

| | | |
|---|---|---|
| EP | 1 315 407 A2 | 5/2003 |
| EP | 1 316 976 A1 | 6/2003 |
| WO | WO 01/67465 A2 | 9/2001 |

OTHER PUBLICATIONS

"Lead Zirconate Titanaate Thin Films On Base–Metal Foils: An Approach For Embedded High K Passive Components" Journal of the American Ceramic Society, 84 (10) 2436 (2001).

* cited by examiner

Primary Examiner—Cathy F. Lam
(74) Attorney, Agent, or Firm—James A. Lamb

(57) ABSTRACT

In one embodiment, a peelable circuit board foil (200) has a metal support layer (205) and a conductive metal foil layer (210) bonded by an inorganic release material (215). The conductive metal foil layer has a an exposed surface (212) that is coated with a high temperature anti-oxidant barrier (220) and has a roughness less than 0.05 microns RMS. In a second embodiment, the peelable printed circuit foil (200) has a crystallized dielectric oxide layer (405) disposed on the exposed surface of the conductive metal foil layer and an electrode layer (415) disposed on the crystallized dielectric oxide layer, forming a dielectric peelable circuit board foil (400) that may be adhered to a layer of a flexible or rigid circuit board, after which the metal support layer can be peeled away, leaving a capacitive structure including the metal foil layer, the crystallized dielectric oxide layer, and the electrode layer.

11 Claims, 1 Drawing Sheet

PEELABLE CIRCUIT BOARD FOIL

BACKGROUND

The present invention generally relates to multi-layer foils suitable for making capacitors that are integrated or embedded in rigid or flexible single or multilayer circuit boards.

In the electronics art, smaller often means better. In the quest to provide smaller electronic appliances, the electronics industry seeks electronic components that are smaller than predecessor components.

The capacitor (a dielectric material sandwiched between two conductors) represents one electronic component that has substantially shrunk in this quest. However, current practice relies largely on individually mounting and soldering each capacitor onto the surface of circuit boards. Despite the advances in capacitor miniaturization, each surface mounted capacitor still occupies a significant fraction of the circuit board surface area, and requires substantial cost to "pick and place" onto the board. For example, a typical cellular phone contains over 200 surface mounted capacitors connected to circuit boards by over 400 solder joints. The ability to integrate or embed capacitors in circuit boards during manufacture of the circuit boards would provide substantial space and cost savings over surface mounted capacitors. Unfortunately, efforts to make capacitors that can be integrated or embedded into circuit boards have either produced capacitors that do not have sufficient capacitance (e.g. <10 pF/mm$^2$) to replace many of the capacitors (e.g., requiring >100 pF capacitance) on a circuit board, or have resulted in structures and processes that have not been scaled up to manufacturing volumes.

Printed circuit boards typically comprise multiple layers of copper and glass-reinforced epoxy or other polymer. The copper is patterned to form the conducting elements of the circuit, and the polymer provides dielectric isolation and mechanical robustness. Polymers are low dielectric constant materials, and therefore parallel plate embedded capacitors formed within the polymer dielectric circuit board do not offer high capacitance density.

Although ceramic dielectrics that have very high dielectric constants are available, they are typically too rigid to be mechanically compatible with organic printed circuit boards. Further, organic printed circuit boards are incompatible with the methods used to form the ceramic dielectric films. Ceramic dielectric films are commonly formed by a broad range of deposition techniques, such as chemical solution deposition (CSD), evaporation, sputtering, physical vapor deposition and chemical vapor deposition. However, in order to achieve the requisite dielectric structure, such techniques typically require either a high-temperature deposition or a high-temperature crystallization. Such temperatures would melt, ignite or otherwise degrade the organic materials in the circuit board substrate.

Furthermore, these processes are incompatible with copper in two ways. First, at the high temperatures and oxidizing conditions needed to form the ceramic dielectric, copper forms a thin layer of copper oxide at the interface between the ceramic dielectric and the copper. This effectively forms an interface layer which will degrade the overall device performance, thus negating any advantage gained by the use of the ceramic dielectric. Second, the reducing atmosphere favored by copper produces excessive defect concentrations and may frustrate phase formation in the dielectric oxide layer. Efforts to form ceramic films at temperatures that are compatible with circuit board components have generally compromised the dielectric properties of the resulting ceramic. For ceramic dielectrics, it is apparent that favorable dielectric properties are intimately linked to a complex crystal structure (i.e., perovskite) that is difficult to develop at lower temperatures.

Dielectric oxides such as lead zirconate titanate (PZT) and lead lanthanum zirconate titanate (PLZT) belong to a particularly promising class of high permittivity ceramic dielectrics with the perovskite crystal structure. When formed by the CSD process, dielectric oxides can be made into very thin, flexible, robust layers with very high dielectric constants. Several methods have been proposed to create a thin structure that is intended to be added to a circuit board using compatible circuit board layering techniques, by adding a thin coating of dielectric oxide to a thin foil of copper. However, the thin structures described are problematic from a manufacturing standpoint because they are vulnerable to undesirable deformations such as wrinkling and creasing that would compromise the surface uniformity of the dielectric oxide. Coating on one side of such thin substrates also compromises the necessary flatness for further uniform processing. A flat structure can be obtained by coating the dielectric oxide on both sides of the substrate, but no simple process has been described for removal of the resulting unwanted dielectric layer. What is needed is a structure and process for adding capacitors formed of high dielectric constant materials to rigid or flexible circuit boards that is economical to manufacture and wherein the structure is in a form compatible with multilayer circuit board stacking techniques that are in wide use today.

BRIEF DESCRIPTION OF THE DRAWINGS

The present invention is illustrated by way of example and not limitation in the accompanying figures, in which like references indicate similar elements, and in which.

Figure 1:
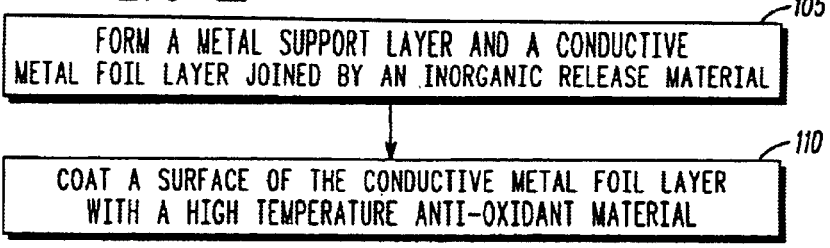
FIG. 1 is a flow chart that shows a method for fabricating a peelable circuit board foil in accordance with an embodiment of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Before describing in detail the particular peelable circuit board foil in accordance with the present invention, it should be observed that the present invention resides primarily in combinations of method steps and apparatus components related to foils for circuit boards. Accordingly, the apparatus components and method steps have been represented where appropriate by conventional symbols in the drawings, showing only those specific details that are pertinent to understanding the present invention so as not to obscure the disclosure with details that will be readily apparent to those of ordinary skill in the art having the benefit of the description herein.

Figure 2:
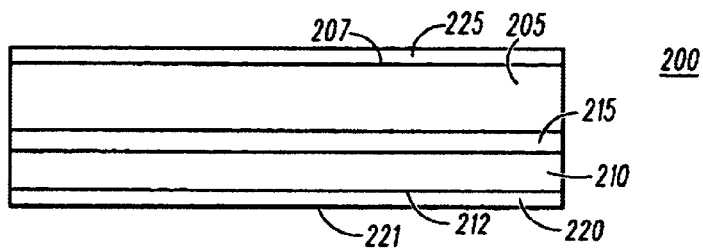
FIG. 2 is a cross section diagram of the peelable circuit board foil fabricated by the method described with reference to FIG. 1.

Referring to FIG. 1, a method for fabricating a peelable circuit board foil 200 is shown, in accordance with an embodiment of the present invention. A cross sectional view of the peelable circuit board foil 200 is shown in FIG. 2. At step 105 (FIG. 1) a metal support layer 205 (FIG. 2) and a conductive metal foil 210 (FIG. 2) are formed that are joined at a first surface of the metal support layer 205 and a second surface of the conductive metal foil 210 using an inorganic release material 215 (FIG. 2). This inorganic release material 216 retains its ability to separate the two metal layers 205, 210 after exposure to high temperatures (used to add a crystallized dielectric layer to the peelable circuit board foil 200, as described below with reference to FIGS. 3 and 4). The inorganic release material consists essentially of a co-deposited admixture of a metal and a non-metal, and may be formed using known techniques such as those described in U.S. Pat. No. 6,346,335,B1 issued to Chen et al. on Feb. 12, 2002. In accordance with this embodiment of the present invention, the metal support layer 205 may be between 10 and 75 microns thick, and for most uses is between 30 and 70 microns thick; the conductive metal foil 210 may be between 5 and 25 microns thick and for most uses is between 10 and 20 microns thick; and the inorganic release material may be less than 0.030 microns thick. Because the present invention is for fabrication of a dielectric foil (and, ultimately, the formation of capacitors in a layer or layers of multi-layer printed circuit boards), the conductive metal foil 210 of the present invention is normally thicker than that used for conventional metal foils having a release layer (for example, see U.S. Pat. No. 6,346,335). The optimum metal for the metal support layer 205 and the conductive metal foil 210 for most applications is copper or a copper alloy, but other metals such as nickel or a nickel alloy could be used.

At step 110 (FIG. 1), a first second surface 212 of the metal foil layer 210 may be coated with a high temperature anti-oxidant barrier 220 (FIG. 2), and the resulting coated first surface (221) has a surface roughness less than 0.05 micron root mean square (RMS). The high temperature anti-oxidant barrier 220 is one that is effective to prevent any substantial oxidation of the conductive metal foil 210 during a later step in which a dielectric oxide is applied, pyrolyzed, and crystallized by known techniques, at temperatures as high as about 600 degrees centigrade, and differs from anti-tarnish coatings used for conventional peelable circuit board foils that perform well at temperatures below 100 degrees centigrade.

This high temperature anti-oxidant barrier may be deposited on the conductive metal foil 210 by sputtering, electroless plating or electrolytic plating materials that may be selected from palladium, platinum, iridium, nickel, or alloys or compositions that include any combination of these metals with other materials, for example, minor amounts of aluminum or other materials, using known techniques that will achieve a surface roughness of less than 0.05 micron RMS, and which will typically achieve a surface roughness less than 0.01 micron RMS.

Electroless or electrolytic nickel phosphorus is useful as the high temperature anti-oxidant in many applications. The phosphorous content of the nickel-phosphorous generally ranges from about 1 to about 40 wt % phosphorous, more specifically about 4–11 wt % and even more specifically about 6–9 wt %. Typically, the technique chosen to coat the conductive metal foil layer 210 will result in a second surface 207 (FIG. 2) of the metal support layer 205 also being coated with the same high temperature anti-oxidant barrier 225 (FIG. 2) to about the same thickness, but this is not a required result for the present invention. For example, a technique such as masking the second surface of the metal support layer 205 with a resist or other polymer material during the plating step would result in the high temperature antioxidant barrier being applied to only to the conductive metal foil 210 becomes joined to the metal support layer 205, leaving the metal support layer 205 uncoated, is an acceptable alternative technique. In contrast to conventional peelable circuit board foils, for example the CopperBond® Thin Copper Foil distributed by Olin Corporation Metals Group of Waterbury, Conn., for which the exposed first surface of the conductive metal foil may be intentionally roughened by a dendrite forming process, the resulting first surface of the conductive metal foil 210 of the present invention is kept smooth, with a roughness measurement less than 0.05 microns root mean square (RMS), and more preferably less than 0.01 micron RMS. Such smoothness can be achieved by known techniques that are used to form the conductive metal foil 210 and the high-temperature anti-oxidant barrier 220. The peelable circuit board foil 200 formed by the method described with reference to FIG. 1 is conveniently able to be made in sizes commensurate with conventional printed circuit boards and handled and shipped without having to use expensive techniques to protect it from wrinkling or treating during shipment, handling, and processing.

Figure 3:
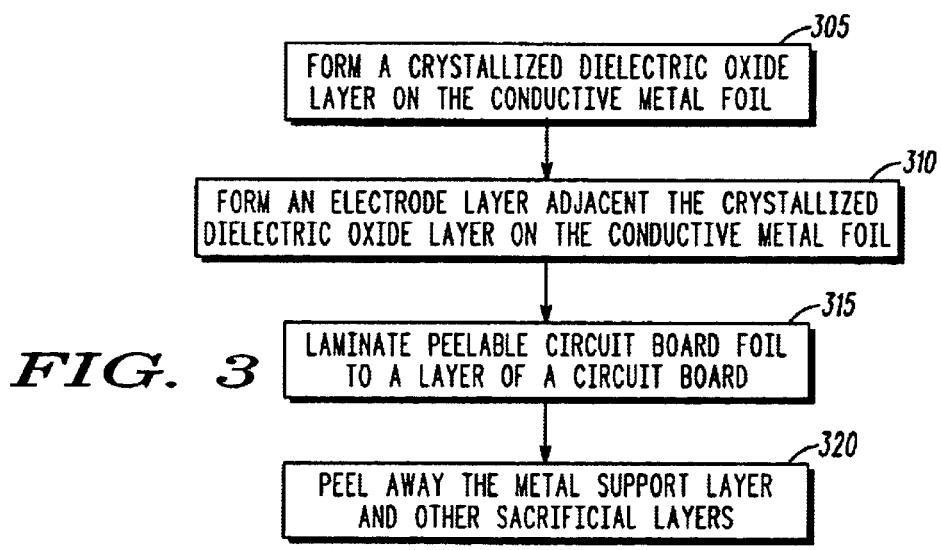
FIG. 3 is a flow chart that shows a method for fabricating a peelable circuit board foil in accordance with a second embodiment of the present invention.
Figure 4:
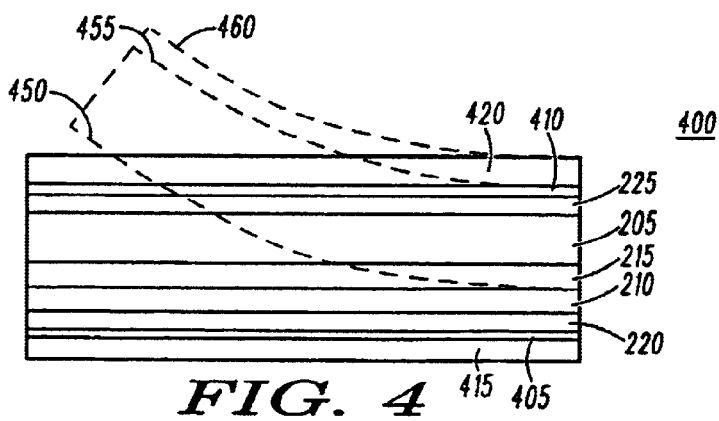
FIG. 4 is a cross section diagram of the peelable circuit board foil fabricated by the method described with reference to FIG. 3.

Referring now to FIG. 3, a method for fabricating a dielectric peelable circuit board foil 400 from the peelable circuit board foil 200 is shown, in accordance with a second embodiment of the present invention. A cross sectional view of the dielectric peelable circuit board foil 400 is shown in FIG. 4. At step 305, a crystallized dielectric oxide layer 405 (FIG. 4) is formed adjacent the conductive metal foil 210 of a peelable circuit board foil 200. Specific examples of the crystallized dielectric oxide according to this invention include lead zirconate titanate (PZT), lead lanthanide zirconate titanate (PLZT), lead calcium zirconate titanate (PCZT), lead lanthanide titanate (PLT), lead titanate (PT), lead zirconate (PZ), lead magnesium niobate (PMN), barium titanate (BTO) and barium strontium titanate (BSTO). Lead based dielectric oxides comprising the PZT system, particularly compositions comprising the PCZT formula $PbCa_x(ZrO_{00.52}Ti_{0.48})O_3$, where x is from 0.01 to 0.1, are particularly attractive. The addition of small quantities of elements such as Ni, Nb, Ca and Sr in compounds that do not specifically name them can also improve electrical performance. Accordingly, the dielectric oxides of the present invention may also contain small quantifies of Ni, Nb, Ca and Sr.

The crystallized dielectric oxide is formed at step 305 by one of a broad range of deposition techniques, such as chemical solution deposition (CSD), evaporation, sputtering, physical vapor deposition and chemical vapor deposition. These techniques typically require either a high-temperature deposition or a high-temperature crystallization, and result in a crystalline coating on the conductive metal foil 210 that is polycrystalline in form and quite flexible, while maintaining excellent dielectric properties for forming capacitors even when flexed. An economical, well known technique that can be used for forming the crystalline dielectric oxide layer is to use CSD. Another economical technique for forming the crystalline dielectric oxide layer is powder coating using a powder or powder suspension. The crystallized dielectric oxide layer 405 may be formed with a thickness from about 0.1 to about 1 micron. When the crystallized dielectric oxide layer 405 is PCZT, it may be formed to be 0.2–0.6 micron thick for many uses. The dip coating technique and other techniques may also result in the formation of a sacrificial crystallized dielectric oxide layer 410 adjacent the metal support layer 205, but this layer is not required for the present invention. Allowing the formation of the sacrificial crystallized dielectric oxide layer is projected to be less costly than attempting to prevent its formation, and serves to reduce curling of the foil layer that may result when only the crystallized dielectric oxide layer 405 is formed.

The peelable circuit board foil 400 formed by the method described with reference to step 305 of FIG. 3 can be conveniently made in sizes commensurate with conventional printed circuit boards and handled and shipped without having to use expensive techniques to protect it from wrinkling or tearing during shipment, handling, and processing. This peelable circuit board foil 400 can then be used to apply the dielectric layer 405 and the conductive metal foil layer 210 within (or on) a flexible or rigid printed circuit board stack to form capacitors having different dielectric areas. This is done by adhering the dielectric layer 405 of the peelable circuit board foil 400 to a conductive metal layer surface of a flexible or rigid printed circuit board stack using an appropriate conductive adhesive material or other known technique, then peeling away the metal support layer 205, the sacrificial crystallized dielectric oxide layer 410, and the high temperature anti-oxidant barrier 226 as indicated by the dotted lines 450, 455 in FIG. 4, followed by well known etching and metal deposition steps that form individual capacitors. In one embodiment, a single capacitor is formed within an entire layer of the printed circuit board, such as for a power source layer.

Referring again to FIGS. 3 and 4, at step 310 (FIG. 3), an electrode layer 415 (FIG. 4) may be formed adjacent the crystallized dielectric layer 405 on the conductive metal foil 210 (i.e., on the surface of the crystallized dielectric layer that is opposite the conductive metal foil 210), using a well known technique such as sputtering or electroless plating or electrolytic plating. A typical thickness for the electrode layer 415 is 2 to 20 microns. Depending on the technique used to apply the electrode layer 415, a sacrificial electrode layer 420 of approximately the same thickness as the electrode layer 416 may also be formed, adjacent the crystallized dielectric layer 410 on the metal support layer 205 (i.e., on the surface of the crystallized dielectric layer that is opposite the metal support layer 205), but this is not required for the present invention.

The peelable circuit board foil with the electrode layer 415 can be laminated to a circuit board substrate at step 315 (FIG. 3), e.g., by pressing onto a prepreg layer (glass-reinforced B-stage epoxy), which is a well known technique that uses pressure and temperature to flow and then cure the epoxy. When the metal support layer 205 is peeled away from the conductive metal foil layer 210 at step 320 (FIG. 3), the sacrificial electrode layer 420, if present, is also peeled away, as shown by dotted lines 450, 460 in FIG. 4.

By now it should be appreciated that the peelable circuit board foils 200, 400 and the processes to fabricate them provide foils that economically facilitate the addition of capacitors to flexible and rigid circuit boards. The inorganic release layer remains effective after exposure to the high temperatures of pyrolysis and crystallizing; the peelable metal support layer and double layers of crystallized dielectric oxide (in one embodiment) help provide a foil that is formed flat and does not wrinkle or crease, and the sacrificial metal support and dielectric oxide layers may be easily removed during the process of adding a capacitive layer to a circuit board using the present invention.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "including" and/or "having", as used herein, are defined as comprising.

What is claimed is:

1. A peelable circuit board foil, comprising:

a metal support layer having a first and a second surface;

a conductive metal foil layer having a first and a second surface; and an inorganic release layer disposed between and contacting the first surface of the metal support layer and the second surface of the conductive metal foil layer, wherein the inorganic release layer consists essentially of a co-deposited admixture of a metal and a non-metal, and wherein the first surface of the conductive metal foil layer is coated with a high temperature anti-oxidant barrier and has a surface roughness that is less than 0.05 microns RMS wherein the high temperature anti-oxidant barrier is formed from palladium, platinum, iridium, nickel, or alloys or compositions that include any combination of these metals.

2. The peelable circuit board foil according to claim 1, wherein the roughness of the second surface of the conductive metal foil layer is less than 0.01 microns RMS.

3. A dielectric peelable circuit board foil, comprising:

a metal support layer having a first and a second surface;

a conductive metal foil layer having a first and a second surface;

an inorganic release layer disposed between and contacting the first surface of the metal support layer and the second surface of the conductive metal foil layer; and a first crystallized dielectric oxide layer disposed adjacent the first surface of the conductive metal foil layer, said first crystallized dielectric oxide layer is selected from the group consisting of lead titanate, lead zirconate, lead magnesium niobate, barium titanate, strontium titanate, and combinations thereof.

4. The dielectric peelable circuit board foil according to claim 3, further comprising a second crystallized dielectric oxide layer disposed adjacent the second surface of the metal support layer.

5. The dielectric peelable circuit board foil according to claim 3, wherein:

the inorganic release layer is less than 0.030 microns thick;

the metal support layer is between 10 and 75 microns thick;

the conductive metal foil layer is between 5 and 25 microns thick; and the first crystallized dielectric oxide layer is less than one micron thick.

6. The dielectric peelable circuit board foil according to claim 3, wherein:

the inorganic release layer is less than 0.030 microns thick;

the metal support layer is between 30 and 70 microns thick;

the conductive metal foil layer is between 10 and 20 microns thick; and the first crystallized dielectric layer is less than one micron thick.

7. The dielectric peelable circuit board foil according to claim 3, further comprising a high temperature anti-oxidant barrier disposed between and contacting the first crystallized dielectric oxide layer and the first surface of the conductive metal foil layer, wherein the high temperature anti-oxidant barrier is formed from a material effective to prevent any substantial oxidation of the conductive metal foil layer during pyrolysis and crystallization of the first crystallized dielectric oxide layer.

8. The dielectric peelable circuit board foil according to claim 7, wherein the high temperature anti-oxidant barrier is formed from palladium, platinum, iridium, nickel, or alloys or compositions that include any combination of these metals.

9. The dielectric peelable circuit board foil according to claim 3, further comprising:

a conductive metal electrode layer disposed adjacent to a surface of the first crystallized dielectric oxide layer that is opposite the conductive metal foil layer.

10. The dielectric peelable circuit board foil according to claim 3, wherein the metal support layer and conductive metal foil layer each comprise a metal selected from a group consisting of copper, copper alloys, nickel, and nickel alloys.

11. The dielectric peelable circuit board foil according to claim 3, wherein the inorganic release layer consists essentially of a co-deposited admixture of a metal and a non-metal selected from the group consisting of oxides, phosphates and chromates of the metal.

* * * * *